United States Patent
May et al.

(10) Patent No.: US 6,633,187 B1
(45) Date of Patent: Oct. 14, 2003

(54) METHOD AND APPARATUS FOR ENABLING A STAND ALONE INTEGRATED CIRCUIT

(75) Inventors: Michael R. May, Austin, TX (US); Marcus W. May, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 186 days.

(21) Appl. No.: 09/716,731

(22) Filed: Nov. 20, 2000

(51) Int. Cl.[7] .................................................. H03K 3/02
(52) U.S. Cl. ........................................ 327/198; 327/544
(58) Field of Search ................................ 327/142, 143, 327/198, 538, 539, 540, 544, 545

(56) References Cited

U.S. PATENT DOCUMENTS

| | | | | |
|---|---|---|---|---|
| 5,073,874 A | * | 12/1991 | Yamada et al. | 365/226 |
| 5,483,187 A | * | 1/1996 | Jang | 327/143 |
| 5,696,461 A | * | 12/1997 | Germini | 327/143 |
| 5,917,255 A | * | 6/1999 | Ciccone | 307/130 |
| 5,991,887 A | * | 11/1999 | Ezell | 713/340 |

* cited by examiner

*Primary Examiner*—Timothy P. Callahan
*Assistant Examiner*—An T. Luu
(74) *Attorney, Agent, or Firm*—Timothy W. Markison

(57) ABSTRACT

A method and apparatus for enabling a stand-alone integrated circuit (IC) includes processing that begins by establishing an idle state that holds at least a portion of the stand-alone integrated circuit in a reset condition when a power source is operably coupled to the stand-alone integrated circuit. A stand-alone integrated circuit includes generally an on-chip power converter, a reset circuit and some functional circuitry, which may be a microprocessor, digital signal processor digital circuitry, state machine, logic circuitry, analog circuitry, and/or any type of components and/or circuits that perform a desired electrical function. When a power enable signal is received, the on-chip power converter is enabled to generate at least 1 supply from the power source. The processing continues by enabling functionality of the stand-alone integrated circuit when the at least one supply has substantially reached a steady state condition.

20 Claims, 4 Drawing Sheets

METHOD AND APPARATUS FOR ENABLING A STAND ALONE INTEGRATED CIRCUIT

TECHNICAL FIELD OF THE INVENTION

This invention relates generally to integrated circuits and more particularly to enabling a stand-alone integrated circuit.

BACKGROUND OF THE INVENTION

Integrated circuits are known to include a large amount of circuitry in a very small area. The circuitry may perform a wide variety of functions such as a microprocessor, digital signal processor, operational amplifier, integrator, audio encoder, audio decoder, video encoder, video decoder, et cetera. To power such integrated circuits, the integrated circuits include power pins for a power input (typically $V_{dd}$) and a return pin (typically $V_{ss}$). The power is typically provided by a regulated external power supply. As such, once the external power supply is up and running, the integrated circuit may be activated in a known state.

For most digital circuits on an integrated circuit, a clock signal is needed. The clock is typically generated once an external power supply is producing a regulated supply voltage to the integrated circuit (IC) and the IC has been activated. To ensure that the digital circuitry begins functioning in a known state, it is important to delay activation of the digital circuit until the power supply is producing a stable supply voltage and the clock is operating properly. Once these operating parameters are ensured, the digital circuitry may be activated.

Insuring the proper enablement of an IC is relatively straightforward when the power supply is external to the IC. If, however, the power converter is on-chip with the digital circuitry and the power converter requires a clock signal to produce a supply voltage, a difficulty arises in enabling such a stand-alone integrated circuit.

Therefore, a need exists for a method and apparatus for enabling a stand-alone integrated circuit that includes an on-chip power converter.

DETAILED DESCRIPTION OF THE PREFERRED EMBODIMENT

Generally, the present invention provides a method and apparatus for enabling a stand-alone integrated circuit (IC). Such a method and apparatus includes processing that begins by establishing an idle state that holds at least a portion of the stand-alone integrated circuit in a reset condition when a power source is operably coupled to the stand-alone integrated circuit. A stand-alone integrated circuit includes generally an on-chip power converter, a reset circuit and some functional circuitry which may be a microprocessor, digital signal processor, digital circuitry, state machine, logic circuitry, analog circuitry, and/or any type of components and/or circuits that perform a desired electrical function. When a power enable signal is received, the on-chip power converter is enabled to generate at least 1 supply (e.g. a voltage supply or current supply) from the power source (e.g. a battery). The processing continues by enabling functionality of the stand-alone integrated circuit when the at least one supply has substantially reached a steady state condition. With such a method and apparatus, a stand-alone integrated circuit may be properly enabled such that when the functional circuitry of a stand-alone integrated circuit is enabled it is enabled in a known state to ensure proper operation of the integrated circuit.

Figure 1:
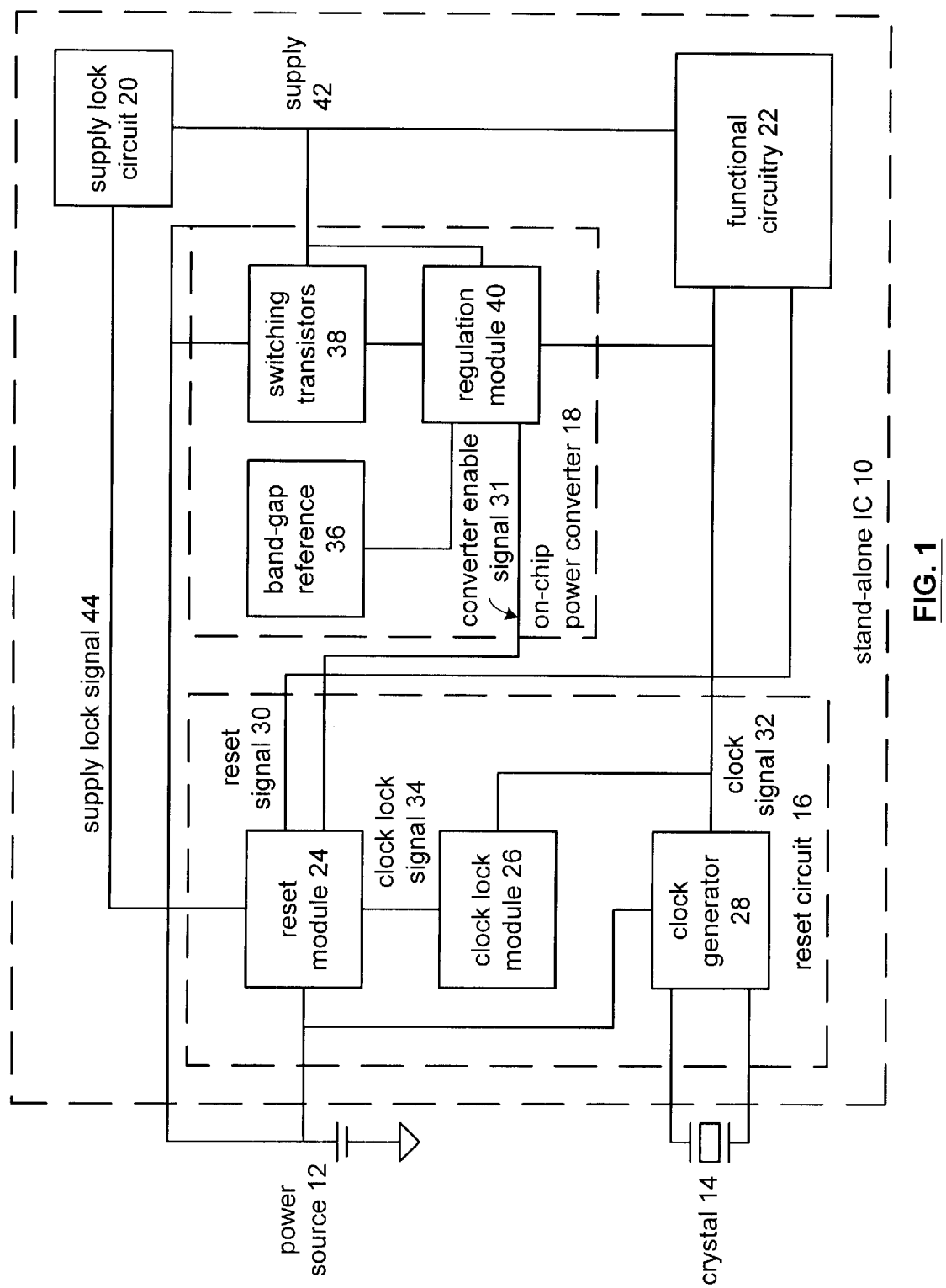
FIG. 1 illustrates a schematic block diagram of a stand-alone integrated circuit in accordance with the present invention.

The present invention can be more fully described with reference to FIGS. 1 through 4. FIG. 1 illustrates a schematic block diagram of a stand-alone integrated circuit 10 that includes a reset circuit 16, an on-chip power converter 18, functional circuitry 22, and a supply lock circuit 20. The stand-alone integrated circuit 10 is operably coupled to an external power source 12, which may be a battery, solar power generator, or other power source that produces a voltage that is not the proper voltage for powering at least a portion of the stand-alone integrated circuit 10. The stand-alone integrated circuit 10 is also operably coupled to an external crystal 14 that provides an oscillation to the reset circuit 16.

The reset circuit 16 includes a reset module 24, a clock lock module 26, and a clock generator 28. When the power source 12 and the crystal 14 are coupled to the stand-alone integrated circuit 10, the clock generator 28 produces a clock signal 32. The clock lock module 26 monitors the clock signal 32 to determine when it has reached a steady state condition. The clock signal 32 has reached a steady state condition typically when it is producing a clock signal at approximately 10% of the ideal frequency of the desired clock signal. Note that the reset circuit 16 will hold the power converter enable signal 31 in an inactive state until the clock lock signal 34 is asserted.

The reset module 24 holds the reset signal 30 low such that the functional circuitry 22 is held in an idle condition until the supply lock signal 44 is asserted as well as the clock lock signal 34. The function of circuitry 22 may be a microprocessor, digital signal processor, state machine, logic circuitry, analog circuitry, and/or any combination of electrical components to perform a desired electrical response given an electrical stimulus.

The on-chip power converter 18 includes a band-gap reference 36, switching transistors 38 and a regulation module 40. The on-chip power converter 18 remains inactive until a power enable signal is asserted. Once asserted, the band-gap reference 36 generates a reference voltage that is supplied to the regulation module 40. The regulation module 40 receives the clock signal 32 and generates control signals that are provided to the switching transistors 38. Based on the control signals, the switching transistors 38 produce a regulated supply 42. The supply lock signal 20 and the functional circuitry 22 receive the regulated supply 42. For a more detailed discussion of the on-chip power converter 18, refer to co-pending patent application having a docket number of SIG000010, entitled METHOD AND APPARATUS FOR REGULATING A DC OUTPUT VOLTAGE, having a Ser. No. of 09/551,123, and a filing date of Apr. 18, 2000.

The supply lock circuit 20 receives the supply 42 and determines when it has reached a steady state. The supply lock circuit 20 determines that the supply 42 reaches a steady state when the supply reaches at least 90% of its desired value. When this occurs, the supply lock circuit 20 generates a supply lock signal 44.

The reset module 24 receives the supply lock signal 44 and, if the clock lock signal 34 is enabled, the reset module 24 clears the reset signal 30 thus removing the functional circuitry 22 from the idle state. Once removed from the idle state, the functional circuitry 22 may perform its desired function(s). As one of average skill in the art will appreciate, multiple functional circuits may be included on the stand-alone integrated circuit where each functional circuit may be controlled by the reset circuit 16 or may each have its own corresponding reset circuit 16. The on-chip power converter 18 may produce multiple supply voltages for powering different types of functional circuitries. For example, analog circuitry may require a 5 volt supply while digital circuitry may require a 3 volt supply. As one of average skill in the art may further appreciate, the clock signal 32 may be delayed from generation until the power enable signal is activated as opposed to being generated upon application of power source 12.

Figure 2:
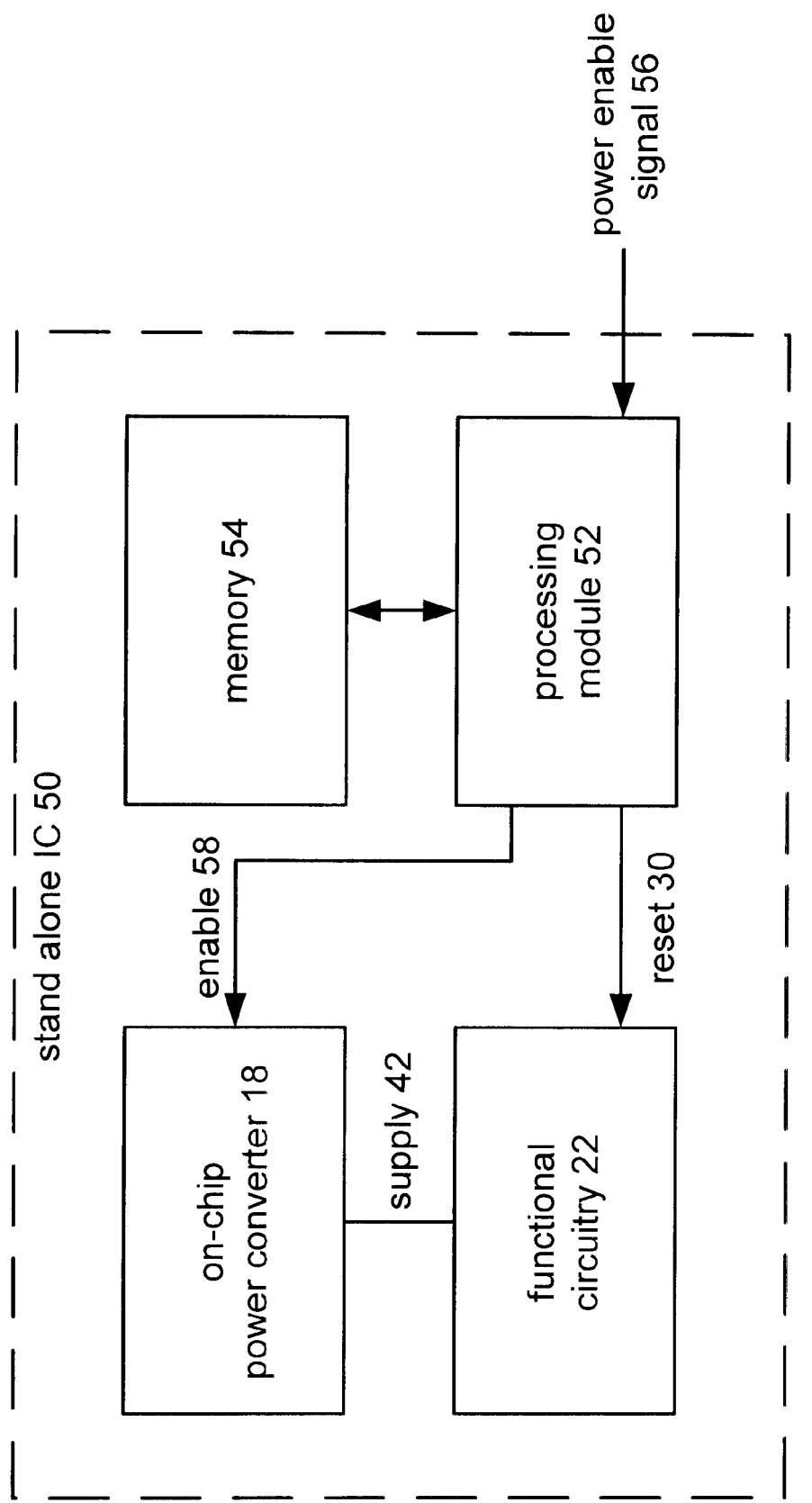
FIG. 2 illustrates a schematic block diagram of an alternate stand-alone integrated circuit in accordance with the present invention.

FIG. 2 illustrates a schematic block diagram of an alternate stand-alone integrated circuit 50. The stand-alone integrated circuit 50 includes the on-chip power converter 18, the functional circuitry 22, a processing module 52, and memory 54. The processing module 52 may be a single processing device or a plurality of processing devices. Such a processing device may be a microprocessor, microcomputer, digital signal processor, state machine, logic circuitry, and/or any device that manipulates signals (analog or digital) based on operational instructions. The memory 54 may be a single memory device or a plurality of memory devices. Such a memory device may be read only memory, random access memory, system memory, and/or any device that stores digital information. Note that when the processing module 52 implements one or more of its functions via a state machine or logic circuit, the memory storing the corresponding operational instruction is embedded within the circuitry comprising the state machine and/or logic circuit.

In general, the processing module 52 receives a power enable signal 56. Based on the power enable signal, the processing module performs a plurality of processing steps, which are discussed in greater detail with reference to FIG. 3, to produce an enable signal 58. The enable signal 58 causes the on-chip power converter 18 to produce supply 42. Once the supply 42 reaches a steady state, the processing module 52 clears the reset signal 30 such that the functional circuit 22 may become active.

Figure 3:
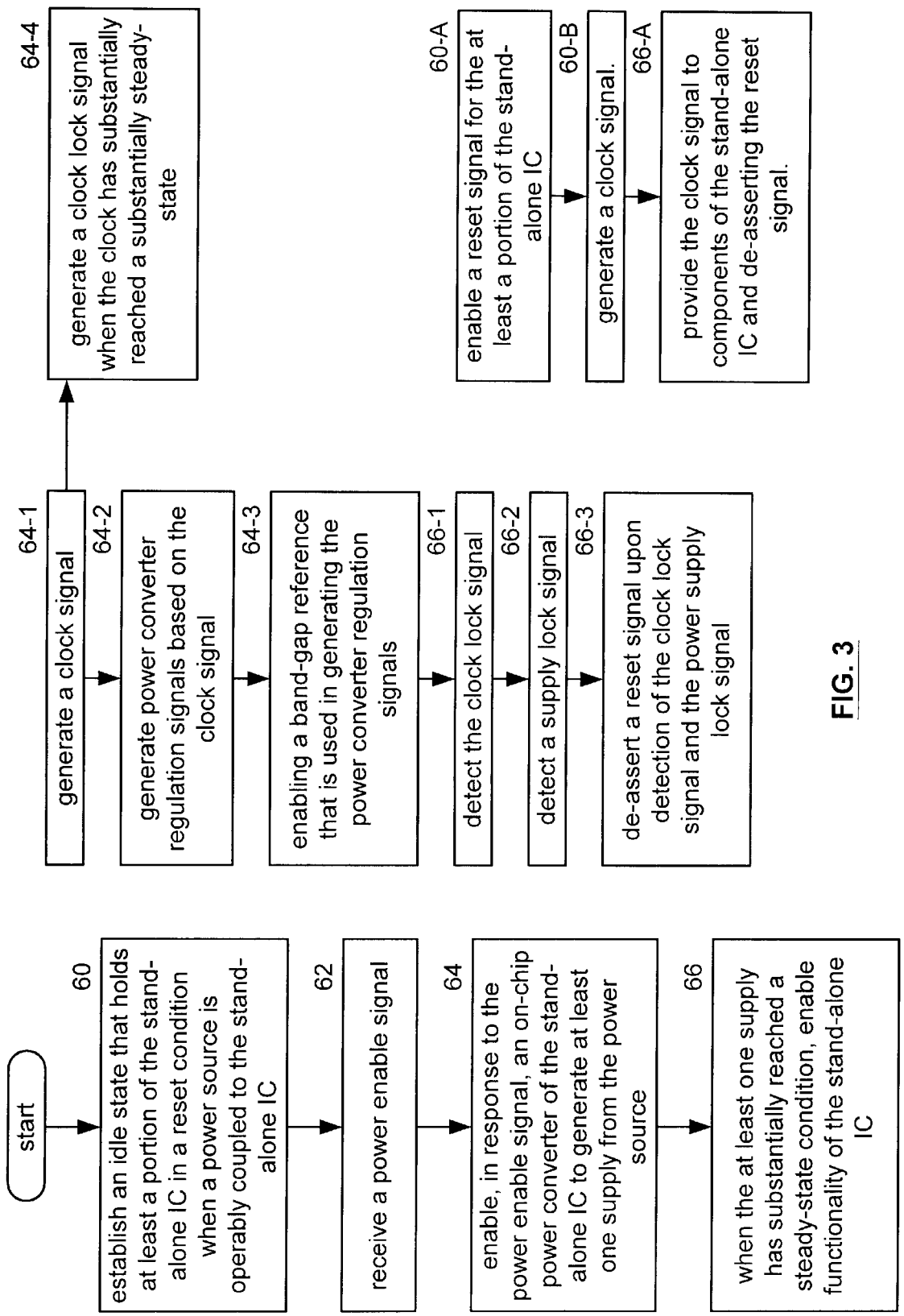
FIG. 3 illustrates a logic diagram of a method for enabling a stand-alone integrated circuit in accordance with the present invention.

FIG. 3 illustrates a logic diagram of a method for enabling a stand-alone integrated circuit. The process begins at Step 60 where an idle state is established. The idle state holds at least a portion of the stand-alone integrated circuit in a reset condition when a power source is operably coupled to the stand-alone integrated circuit. For example, when a battery is coupled to the stand-alone integrated circuit the functional circuitry is held in an idle, or inactive state. The process then proceeds to Step 62 where a power enable signal is received. The process then proceeds to Step 64 where, in response to the power enable signal, an on-chip power converter of the stand-alone integrated circuit is enabled to generate at least one supply from the power source. The on-chip power converter may produce one or more supplies, which may be a voltage supply, or a current supply, for powering different functional circuits of the stand-alone integrated circuit. The process then proceeds to Step 56 where the functional circuitry of the stand-alone circuit is enabled when the at least one supply has substantially reached a steady state condition.

Processing Steps 64 and 66 may be described in further detail with reference to Steps 64-1 through 64-4 and Steps 66-1 through 66-3. At Step 64-1, a clock signal is generated. The processing then proceeds to Step 64-2 and Step 64-4. At Step 64-4, a clock lock signal is generated when the clock has substantially reached a steady state condition. At Step 64-2, power converter regulation signals are generated based on the clock signal. The process then proceeds to Step 64-3 where a band-gap reference is enabled. The band-gap reference is used to generate the power converter regulation signals. The process then proceeds to Step 66-1 where the clock lock signal is detected. The process then proceeds to Step 66-2 where a supply lock signal is detected. The process then proceeds to Step 66-3 where the reset signal is de-asserted upon detection of the clock lock signal and the power supply lock signal.

The processing of Step 60 may further be described with reference to Steps 60-A to Step 60-B and Step 66-A. At Step 60-A, a reset signal is enabled for at least a portion of the stand-alone integrated circuit. The portion of the stand-alone integrated circuit may be for a corresponding functional circuitry where each functional circuitry has its own reset signal or the reset signal may be applicable for the entire integrated circuit. The process then proceeds to Step 60-B where a clock signal is generated. The process then proceeds to Step 66-A where the clock signal is provided to the components of the stand-alone integrated circuit and the reset signal is de-asserted.

Figure 4:
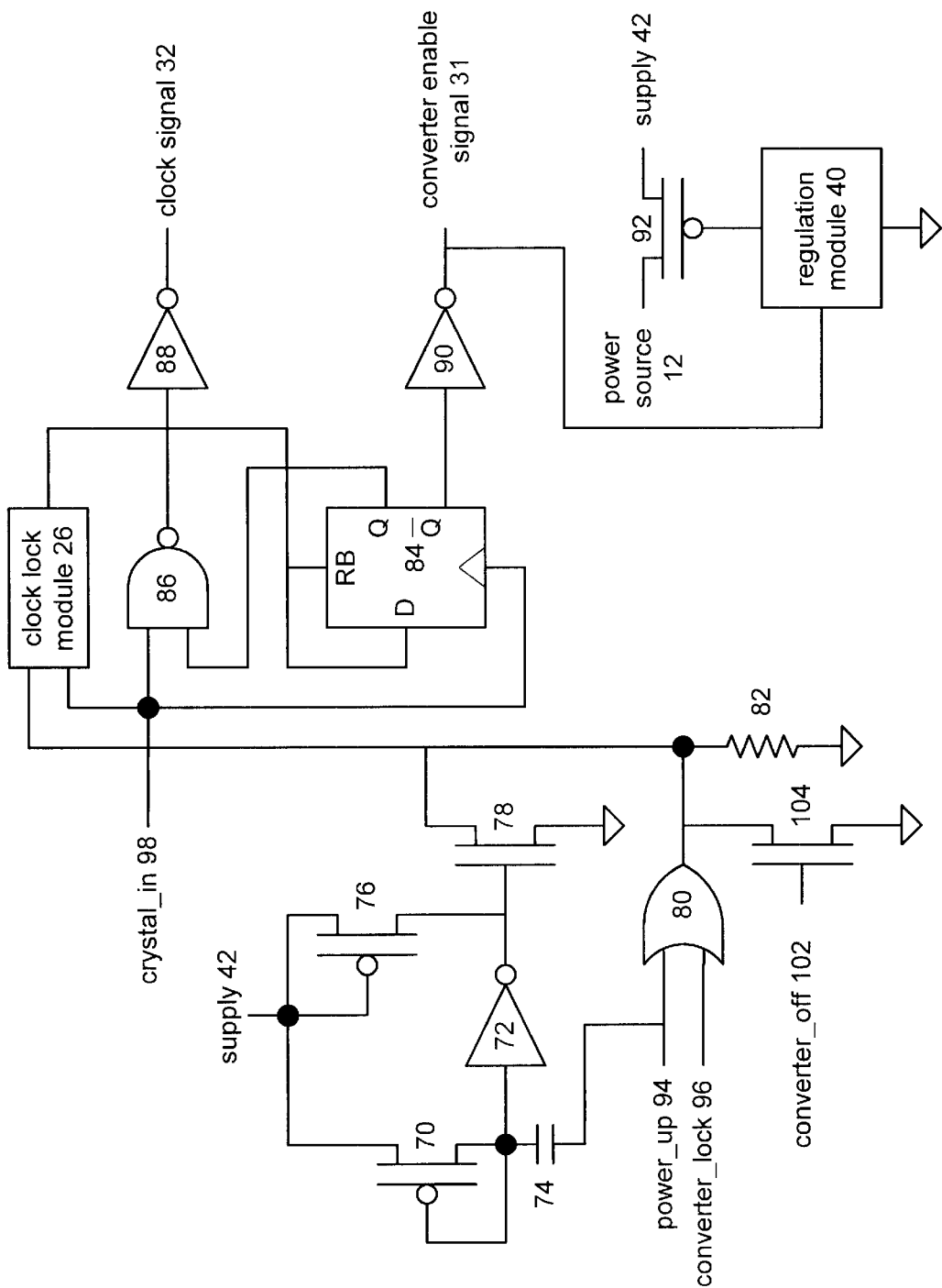
FIG. 4 illustrates a schematic block diagram of an embodiment of the reset circuit of FIG. 1.

FIG. 4 illustrates a schematic block diagram of an embodiment of the reset circuit 16. The reset circuit 16 includes P-channel transistors 70 and 76, N-channel transistors 78 and 104, and logic elements 72, 80, 86, 88, 84, and 90. Also shown in FIG. 4 are the regulation module 40, a transistor 92 of the switching transistors 38, and the clock lock module 26.

When the power source 12 is coupled to the stand-alone integrated circuit and the power enable, or power-up signal 94, has not been activated, resistor 82 holds the output of OR gate 80 low such that the power converter enable signal 31 is low. The regulation module 40 then pulls the gate of transistor 92 low, making the power source 12 substantially equal to the power supply 42. By enabling the power source to be coupled to the supply 42 in this manner, power can be provided to limited portions of the stand-alone integrated circuit including portions of the reset circuit 16 and the clock generator 28. With the power source connected to the stand-alone integrated circuit and the crystal 14 connected to the stand-alone integrated circuit, a crystal input 98 is provided to an input of a NAND gate 86 and to an input of the clock lock module 26. The other input of NAND gate 86 is received from the non-inverting output of D flip-flop 84. The output of NAND gate 86 is coupled to inverter 88 wherein the output of inverter 88 is the clock signal 32. The inverting output of D flip-flop 84 is coupled to inverter 90 wherein the output of inverter 90 corresponds to the power converter enable signal 31. The other input of the clock lock module 26 is the output of the logic gate 38. The output of the clock lock module 26 is connected to the RB and D inputs of the D-flip-flop 84.

When the power-up signal 94 is enabled, the output of OR gate 80 goes high thereby enabling the clock lock module 26. Once the output of the clock lock module 26 goes high, the power converter enable signal 31 is activated. This causes the regulation module 40 to provide a control signal to transistor 92 such that the supply 42 is generated at the desired output level. Once the supply has reached a steady state condition, the converter lock signal 96 is generated thereby holding the output of OR gate 80 high. Note that the reset signal 30 could be generates as a signal equivalent to the converter lock signal 96 or as a logic AND of the converter lock signal 96 and the output of the clock lock module 26.

When the on-chip converter is turned off, the converter off signal 102 is activated high thereby enabling transistor 104. This actively pulls down on the output of logic gate 80 causing the clock lock module 26 to be disabled. This, in turn, resets the D flip-flop 84 and returns the regulation module 40 to a reset condition.

The preceding discussion has presented a method and apparatus for enabling a stand-alone integrated circuit. A stand-alone integrated circuit includes its own on-chip power converter such that an appropriate sequence of enabling the circuitry is performed to conserve power and to insure accurate startup of the integrated circuit. As one of average skill in the art will appreciate, other embodiments may be derived from the teaching of the present invention without deviating from the scope of the claims or spirit of the invention.

What is claimed is:

1. A method for enabling a stand-alone integrated circuit (IC), the method comprises the steps of:
   a) establishing an idle state that holds at least a portion of the stand-alone IC in a reset condition when a power source is operably coupled to the stand-alone IC;
   b) receiving a power enable signal;
   c) enabling, in response to the power enable signal, an on-chip power converter of the stand-alone IC to generate at least one supply from the power source, wherein the enabling includes:
      generating a clock signal;
      generating power converter regulation signals based on the clock signal;
      enabling a band-gap reference that is used in generating the power converter regulation signals; and
   d) when the at least one supply has substantially reached a steady-state condition, enabling functionality of the stand-alone IC.

2. The method of claim 1, wherein the establishing the idle state further comprises enabling a reset signal for the at least a portion of the stand-alone IC.

3. The method of claim 2, wherein the establishing the idle state further comprises generating a clock signal.

4. The method of claim 3, wherein the enabling of the functionality of the stand-alone IC further comprises providing the clock signal to components of the stand-alone IC and de-asserting the reset signal.

5. The method of claim 2, wherein the establishing the idle state further comprises generating a clock signal.

6. The method of claim 1, wherein the enabling the on-chip converter further comprises:
   generating a first supply from the power source; and
   generating a second supply from the power source, wherein the first and second supplies are produced by regulating energy transfer from a single inductor.

7. The method of claim 1 further comprises generating a clock lock signal when the clock has substantially reached a substantially steady-state.

8. The method of claim 7, wherein the enabling functionality of the stand-alone IC further comprises:
   detecting the clock lock signal; and
   detecting a supply lock signal; and
   de-asserting a reset signal upon detection of the clock lock signal and the power supply lock signal.

9. A stand-alone integrated circuit (IC) comprises:
   a reset circuit operable to place the stand-alone IC in an idle state until a supply lock signal is enabled;
   an on-chip power converter that generates a supply from an external power source upon assertion of a power enable signal; and
   supply lock circuit operably coupled to enable the supply lock signal when the supply substantially reaches a steady-state condition.

10. The stand-alone IC of claim 9, wherein the on-chip power converter further comprises:
    switching transistors operably coupled to produce a first supply and a second supply from the external power source and a single inductor, and
    regulation module operably coupled to the switching transistors, wherein the regulation module produces control signals that enable and disable transistors of the switching transistors to regulate the first and second supplies.

11. The stand-alone IC of claim 9, wherein the reset circuit further comprises:
    clock generator operably coupled to produce a clock signal when the external power source is coupled to the standalone IC, wherein the clock signal is provided to the on-chip power converter such that the on-chip power converter generates the supply;
    clock lock module operably coupled to generate a clock lock signal when the clock signal has substantially reached a steady-state condition;
    reset module operably coupled to assert a reset signal when the external power source is coupled to the stand-alone IC, wherein the reset module de-asserts the reset signal when the clock lock signal and the supply lock signal are asserted such that functionality of the stand-alone IC is enabled.

12. The stand-alone IC of claim 9, wherein the on-chip power converter further comprises:
    a band-gap reference that produces a reference voltage upon assertion of the power enable signal.

13. A stand-alone IC comprises:
    on-chip power converter;
    processing module; and
    memory operably coupled to the processing module, wherein the memory includes operational instructions that cause the processing module to:
       establish an idle state that holds at least a portion of the stand-alone IC in a reset condition when a power source is operably coupled to the stand-alone IC;
       receive a power enable signal;
       enable, in response to the power enable signal, the on-chip power converter of the stand-alone IC to generate at least one supply from the power source; and
       when the at least one supply has substantially reached a steady-state condition, enable functionality of the stand-alone IC.

14. The stand-alone IC of claim 13, wherein the memory further comprises operational instructions that cause the processing module to enable the on-chip converter further comprises:

generate a first supply from the power source; and generate a second supply from the power source, wherein the first and second supplies are produced by regulating energy transfer from a single inductor.

15. The stand-alone IC of claim 13, wherein the memory further comprises operational instructions that cause the processing module to establish the idle state by enabling a reset signal for the at least a portion of the stand-alone IC.

16. The stand-alone IC of claim 15, wherein the memory further comprises operational instructions that cause the processing module to enable the functionality of the stand-alone IC by providing the clock signal to components of the stand-alone IC and de-asserting the reset signal.

17. The stand-alone IC of claim 13, wherein the memory further comprises operational instructions that cause the processing module to enable the on-chip power converter by:

generating a clock signal; and generating power converter regulation signals based on the clock signal.

18. The stand-alone IC of claim 17, wherein the memory further comprises operational instructions that cause the processing module to enable the on-chip power converter by enabling a band-gap reference that is used in generating the power converter regulation signals.

19. The stand-alone IC of claim 17, wherein the memory further comprises operational instructions that cause the processing module to generate a clock lock signal when the clock has substantially reached a substantially steady-state.

20. The stand-alone IC of claim 19, wherein the memory further comprises operational instructions that cause the processing module to enable functionality of the stand-alone IC further comprises:

detect the clock lock signal; and detect a supply lock signal; and de-assert a reset signal upon detection of the clock lock signal and the power supply lock signal.

* * * * *

(12) INTER PARTES REEXAMINATION CERTIFICATE (0202nd)
United States Patent
May et al.

(10) Number: US 6,633,187 C1
(45) Certificate Issued: Nov. 2, 2010

(54) METHOD AND APPARATUS FOR ENABLING A STAND ALONE INTEGRATED CIRCUIT

(75) Inventors: Michael R. May, Austin, TX (US);
Marcus W. May, Austin, TX (US)

(73) Assignee: Citibank, N.A., New York, NY (US)

Reexamination Request:
No. 95/000,198, Nov. 22, 2006

Reexamination Certificate for:
Patent No.: 6,633,187
Issued: Oct. 14, 2003
Appl. No.: 09/716,731
Filed: Nov. 20, 2000

(51) Int. Cl.
*H03K 3/02* (2006.01)

(52) U.S. Cl. .................................... 327/198; 327/544
(58) Field of Classification Search .................. None
See application file for complete search history.

(56) References Cited

U.S. PATENT DOCUMENTS 5,917,255 A * 6/1999 Ciccone
5,936,443 A * 8/1999 Yasuda et al.

OTHER PUBLICATIONS

PCA5010 Pager Baseboard Controller, Philips Semiconductor, Data Sheet, Production Specification (Nov. 2, 1998), 112 pages.*
Micronas MAS 3507D, MPEG 1/2 Layer 2/3, Audio Decoder (Oct. 21, 1998), 48 pages.*
Micronas MAS 3509F, MPEG Layer 2/3, AAC Audio Decoder, G.729 Annex A Codec (Aug. 4, 2000).*

* cited by examiner

*Primary Examiner*—Margaret Rubin

(57) ABSTRACT

A method and apparatus for enabling a stand-alone integrated circuit (IC) includes processing that begins by establishing an idle state that holds at least a portion of the stand-alone integrated circuit in a reset condition when a power source is operably coupled to the stand-alone integrated circuit. A stand-alone integrated circuit includes generally an on-chip power converter, a reset circuit and some functional circuitry, which may be a microprocessor, digital signal processor digital circuitry, state machine, logic circuitry, analog circuitry, and/or any type of components and/or circuits that perform a desired electrical function. When a power enable signal is received, the on-chip power converter is enabled to generate at least 1 supply from the power source. The processing continues by enabling functionality of the stand-alone integrated circuit when the at least one supply has substantially reached a steady state condition.

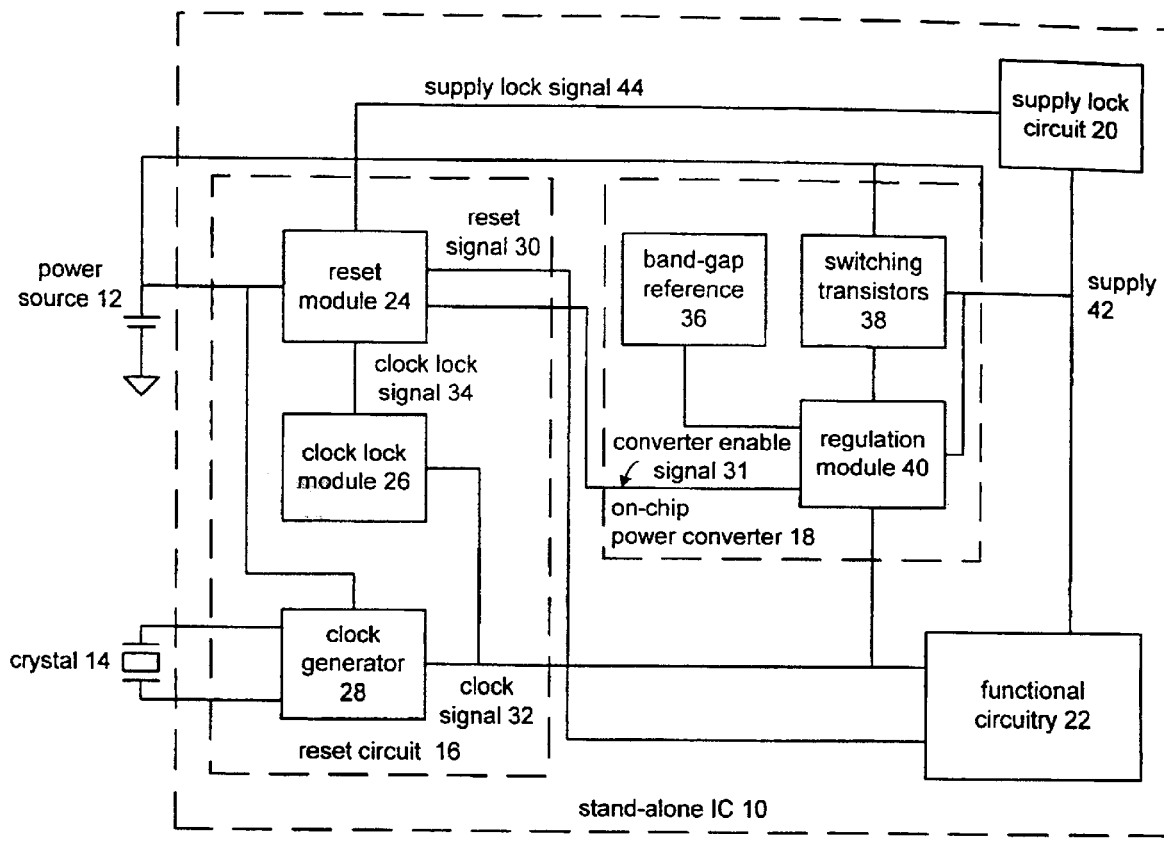

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

The patentability of claims 1-5, 12, 13 and 15-18 is confirmed.

Claim 9 is cancelled.

Claims 6-8, 10, 11, 14, 19 and 20 were not reexamined.

* * * * *